(12) United States Patent  
Sharpe et al.

(10) Patent No.: US 6,973,637 B2  
(45) Date of Patent: Dec. 6, 2005

(54) PROCESS FOR THE SELECTIVE CONTROL OF FEATURE SIZE IN LITHOGRAPHIC PROCESSING

(75) Inventors: John M. Sharpe, Allentown, PA (US); Jerome Chu, Allentown, PA (US); Matthew Moucheron, Allentown, PA (US); Mary Roby, Plano, TX (US)

(73) Assignee: Agere Systems Inc., Allentown, PA (US)

( * ) Notice: Subject to any disclaimer, the term of this patent is extended or adjusted under 35 U.S.C. 154(b) by 82 days.

(21) Appl. No.: 10/435,870

(22) Filed: May 12, 2003

(65) Prior Publication Data

US 2004/0230938 A1    Nov. 18, 2004

(51) Int. Cl.[7] ............................................. G06F 17/50
(52) U.S. Cl. ......................................... 716/21; 716/19
(58) Field of Search ..................... 716/21, 19

(56) References Cited

U.S. PATENT DOCUMENTS

| | | |
|---|---|---|
| 4,895,780 A | 1/1990 | Nissan-Cohen et al. |
| 5,723,233 A | 3/1998 | Garza et al. |
| 6,225,134 B1 | 5/2001 | Meisner |
| 6,269,472 B1 | 7/2001 | Garza et al. |
| 6,275,971 B1 | 8/2001 | Levy et al. |
| 6,335,130 B1 * | 1/2002 | Chen et al. ................... 430/5 |
| 6,370,679 B1 | 4/2002 | Chang et al. |
| 6,444,373 B1 | 9/2002 | Subramanian et al. |
| 6,596,444 B2 * | 7/2003 | Buck ........................... 430/5 |
| 6,783,904 B2 * | 8/2004 | Strozewski et al. ......... 430/30 |
| 2002/0152453 A1 | 10/2002 | Rittman |

* cited by examiner

*Primary Examiner*—Sun James Lin (57) ABSTRACT

The present invention provides a non-global process for designing an integrated circuit layout. The process comprises locating an isolated layout feature of an integrated circuit layout and non-globally changing at least one lateral dimension of the isolated layout feature to obtain an optimized increment. The change in lateral dimension by the optimized increment does not violate a minimum separation distance between the isolated layout feature and the other adjacent layout features. The process may be incorporated into a system for non-globally modifying an integrated circuit layout, described in a data file or an integrated circuit design system.

18 Claims, 10 Drawing Sheets

PROCESS FOR THE SELECTIVE CONTROL OF FEATURE SIZE IN LITHOGRAPHIC PROCESSING

TECHNICAL FIELD OF THE INVENTION

The present invention is directed, in general, to integrated circuits and, more specifically, to a non-global process for fabricating layout patterns of submicron features in an integrated circuit where isolated submicron features are to be produced.

BACKGROUND OF THE INVENTION

Integrated circuits often include isolated features known as pillars, bond pads or contact heads. The isolated features are commonly made of conductive materials, such as metals, thereby forming minimal area contact heads or landing pads for vias to electrically connect one metal level to another metal level in the integrated circuit. As integrated circuit layout dimensions decrease to 0.25 microns and below, however, isolated features have become smaller, and consequently more susceptible to fracture, or they fail to make a proper contact due to misaligned layers in the integrated circuit.

Metal-etch lithographic procedures performed to define the pillar invariably causes some shrinkage of the isolated feature. Shrinkage of a pillar, for example, can cause the electrical contact with the pillar to be missed or partially landed, resulting in an open or partially conductive connection. In addition, pillars are weakened during etching procedures performed during metal-etch lithographic processing of the integrated circuit. Over-etching of pillars during pattern definition and transfer adversely results in a weakened pillar structure. Such structures are prone to toppling or breakage during the fabrication of the integrated circuit or during field use of the completed device that incorporates the use of the integrated circuit. This, in turn, results in a decreased yield of functional integrated circuits produced by the semiconductor fabrication process and decreased reliability of devices that include such integrated circuits.

Accordingly, what is needed in the art is a process for designing integrated circuit layouts that compensate for the over-etching of isolated features, without violating the minimum spacing design rules for the circuit layout.

SUMMARY OF THE INVENTION

To address the above-discussed deficiencies of the prior art, one embodiment of the present invention provides a non-global process for fabricating an integrated circuit having at least one isolated feature. This embodiment includes lithographically defining an isolated feature in a layer of a material wherein at least one dimension of the isolated feature is selected by locating an isolated layout feature of an integrated circuit layout and changing at least one lateral dimension of the isolated layout feature to obtain an optimized increment. The isolated layout feature is located adjacent to another layout feature of the integrated circuit layout. The change in lateral dimension by the optimized increment does not violate a minimum separation distance between the isolated layout feature and the adjacent other layout feature and the non-global process leaves non-isolated features unchanged.

Another embodiment is a system for non-global modification of an integrated circuit layout, described in a data file comprising an isolation subsystem and a modification subsystem configured carry out the above-described processes.

Yet another embodiment is an integrated circuit design system. The system comprises a computer configured to read a data file having an integrated circuit layout stored therein. The system also includes a computer readable media capable of causing the computer to non-globally modify the data file by the above-described process.

The foregoing has outlined preferred and alternative features of the present invention so that those of ordinary skill in the art may better understand the detailed description of the invention that follows. Additional features of the invention are described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is directed to a non-global lithographic process for device fabrication or mask fabrication. The process is a non-global process because it is applied to certain identified isolated features that are prone to weakening and breakage due to etching and leaves non-isolated features unchanged. Lithographic processes are used to fabricate devices, such as integrated circuit devices, optical devices, micro-electromechanical (MEMS) devices, etc. In lithographic processes, a pattern is defined and developed in an energy sensitive material. The pattern is then used as an etch mask to transfer the pattern into a layer of material underlying the energy sensitive material. The underlying layer of material is referred to generically as a substrate. One skilled in the art will appreciate that, in device fabrication, the pattern is typically transferred into a layer of material formed over a bulk substrate.

In an embodiment of the non-global process covered by the present invention, the pattern contains at least one isolated feature. The isolated feature has at least one dimension that is selected by evaluating the pattern (i.e., the layout) and changing at least one lateral dimension of the isolated feature in the layout to obtain an optimized feature dimension. This embodiment can be used to improve integrated circuit design layout procedures to compensate for the weakening and breakage of isolated features during integrated circuit fabrication.

Contrast the non-global process of the present invention to a undesirable global process, where a design layout is modified by globally increasing the area of all the layout features by a uniform amount. In a global process, in which the entire perimeter of all the layout features are increased by an uniform amount, once all the features are modified, they all must then be examined to determine whether the added area must be then subtracted. Such a global procedure, however, fails to consider that certain layout features may now be situated closer to other layout features than allowed by the minimum spacing design rule for the integrated circuit layout. This, in turn, is more complicated and time consuming and could possibly increase the likelihood of a short-circuit in the integrated circuit fabricated from such modified layouts.

In contrast to these current practices, the present invention provides a non-global process for increasing the size of isolated features, as much as possible, without violating minimum spacing design rules, as further discussed below. Integrated circuits fabricated from integrated circuit layouts incorporating the present invention have more uniform isolated features. Consequently, the yield of functional integrated circuits produced per wafer is greater than that obtained using conventionally designed integrated circuit layouts.

Figure 1A:
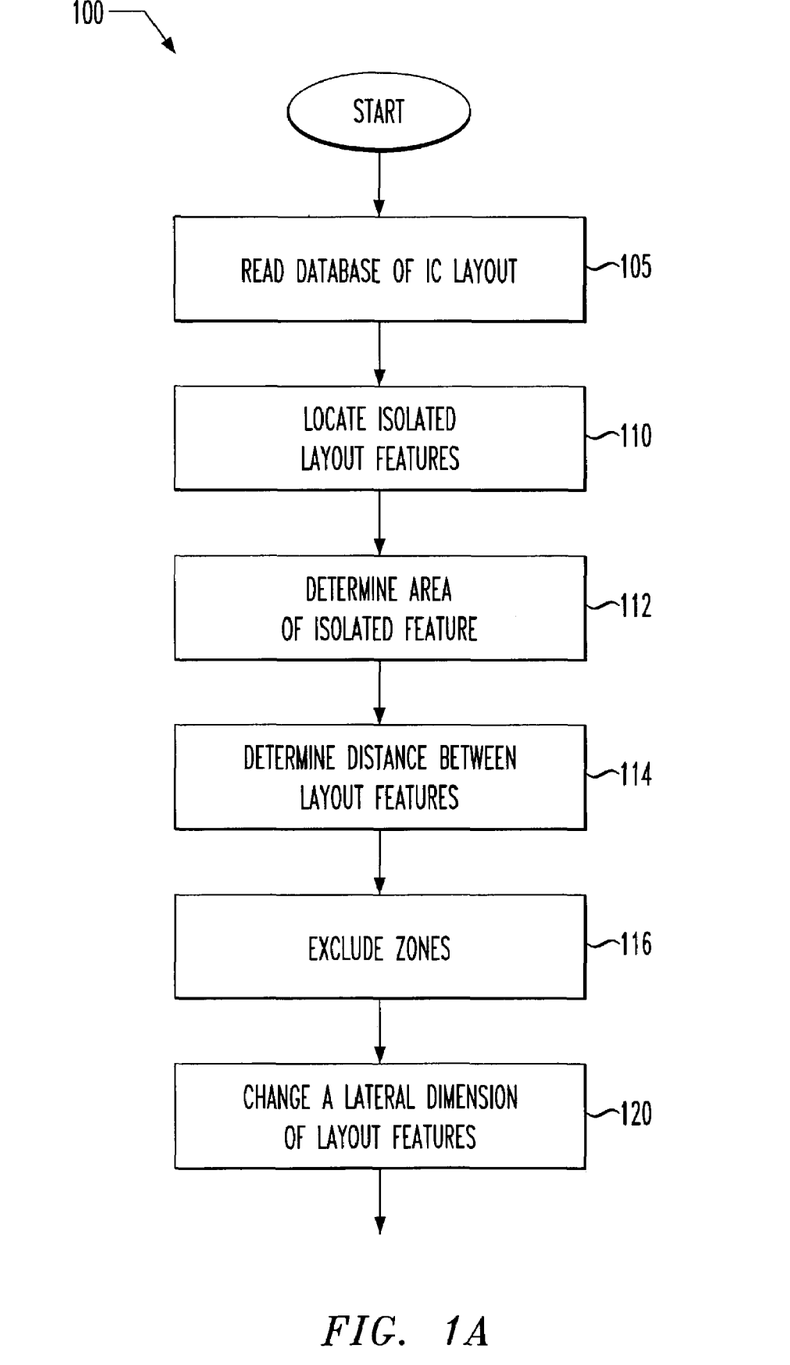
FIGS. 1A and 1B illustrates by flow diagram, a non-global process for designing an integrated circuit layout according to the principles of the present invention.
Figure 1B:
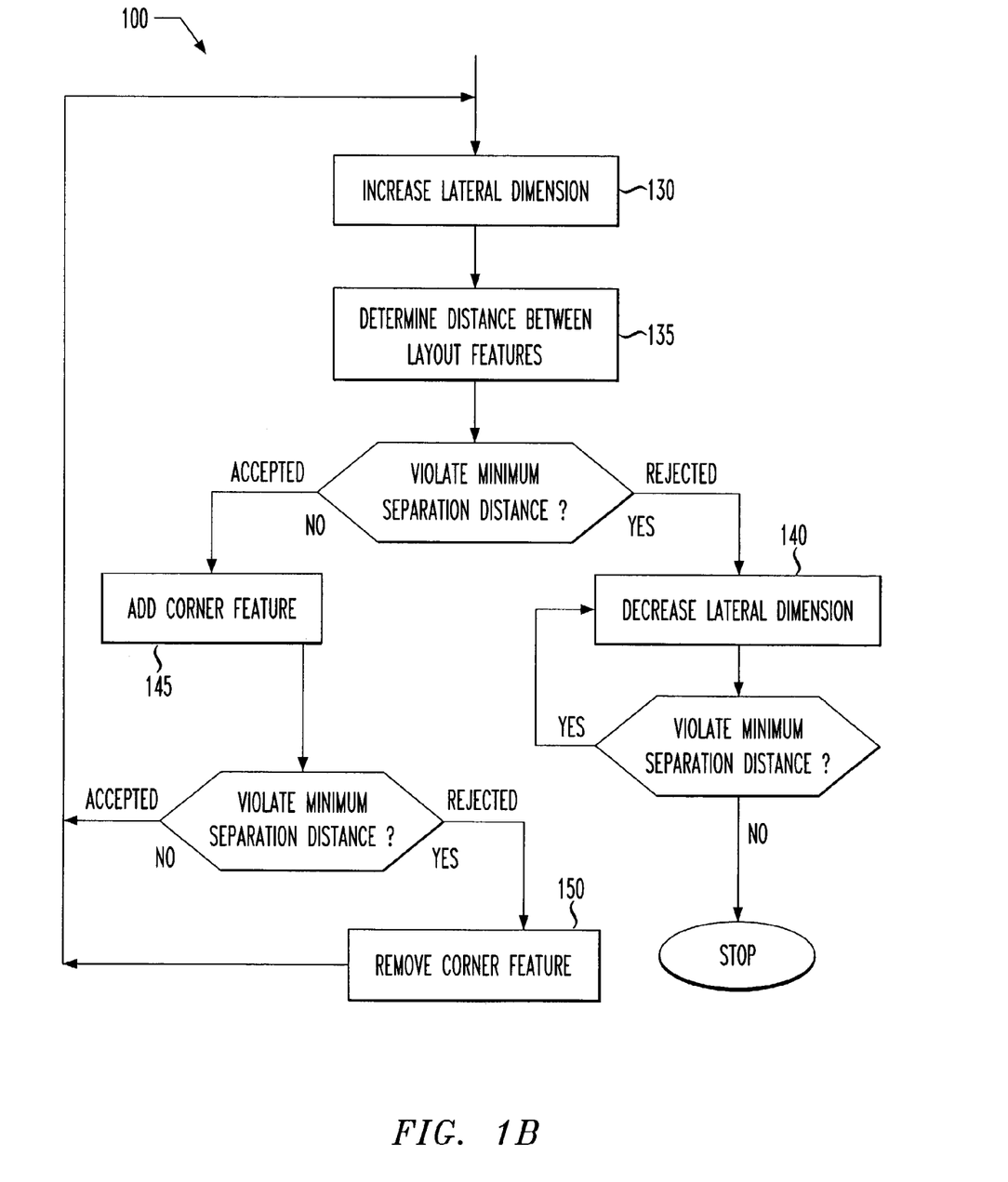

FIGS. 1A and 1B illustrate by flow diagram, one embodiment of the present invention, which is a non-global process 100 for designing an integrated circuit layout. One skilled in the art would understand that the process 100 can be advantageously applied to the layout design of a variety of semiconductor or other submicron features. In particular, however, this embodiment is advantageously applied to strengthen isolated metal features that are susceptible to weakening by metal-etch photolithography, such as wet or dry etching.

Turning to FIG. 1A, the non-global process 100 commences, at step 105 by reading a database that contains an integrated circuit layout. An isolated layout feature of an integrated circuit layout is located in step 110. In certain preferred embodiments, the isolated layout feature has a parallelopiped structure, having a height dimension that is substantially greater than its length or width dimensions. For instance, the length and width dimensions are located in the same lateral dimension of the layout, corresponding to one layer in the integrated circuit layout, while the height dimension is perpendicular to the plane of the layer. The isolated layout feature, however, may also have other geometric shapes, such as cylindrical or cubic. In still other embodiments, the isolated layout feature is a portion of a metal line.

Isolated layout features may be located by any number of procedures, including area measurements, or individual width and length determinations of features present in the integrated circuit layout. In certain advantageous embodiments, for example, following step 110, an area of a target layout feature of the isolated feature is determined in step 112, when the area is within a predefined range. For instance, in certain embodiments, where the isolated layout feature has a parallelopiped structure, the predefined area range is between about 0.04 and about 0.09 microns$^2$, and more preferably between about 0.058 and about 0.068 microns$^2$. In other embodiments, isolated layout features are identified as those features having a width within a certain range, for example, between about 0.2 and about 0.3 microns. Of course, it should be understood that these area ranges are given as examples only, and the present invention is not limited to these exemplary area ranges.

Locating the isolated layout feature also preferably includes a step 114 of determining a distance between the target isolated feature and another layout feature of the integrated circuit layout. Preferably, a predefined minimum distance away from all other features must exist in order qualify the target layout feature as an isolated feature. In certain exemplary embodiments, for example, the predefined minimum distance ranges from about 0.4 microns to about 1 micron. It should be noted that non-isolated features are not modified, and therefore, left unchanged by this embodiment.

In other specific embodiments, locating the isolated layout feature includes a step 116, of excluding a zone of the integrated circuit layout, where it is undesirable to alter layout features within the zone. In certain cases, for example, it is desirable not to risk altering the shape of certain features. In other instances, the excluded zone includes ancillary layout features, whose shape and dimensions are used for line width control during photolithography, or trigger level layout features, used to identify certain features or other zones in the layout for subsequent circuit fabrication steps.

The non-global process also includes in step 120, the step of changing at least one lateral dimension of the isolated layout feature to obtain an optimized increment. In certain instances, all the lateral dimensions of the isolated layout feature are changed by their respective optimized increments. In other instances, only one lateral dimension of the isolated layout is changed by its particular optimized increment. The change in lateral dimension by the optimized increment, however, must not violate a minimum separation distance between the isolated layout feature and the other layout features. A violation occurs if the distance between another layout feature and the isolated layout feature with the optimized increment added to it is less than a minimum separation distance.

Minimum separation distances are defined by the characteristics of the particular type of integrate circuit layout being designed. One skilled in the art understands that numerous factors are considered in formulating design rules for integrated circuit layouts, including the minimum separation distance between device features. In certain embodiments, for example, a minimum separation distance of about 0.24 microns is considered necessary to prevent short circuits in the integrated circuit. Moreover, the predefined minimum separation distance may be different for different zones of the integrated circuit layout. Therefore, in certain embodiments, testing for minimum separation distance violations is facilitated by grouping or binning together all zones of the layout that have the same minimum separation distance rule.

Turning now to FIG. 1B, which is a continuation of the flow diagram of FIG. 1A, the lateral dimension of the isolated layout feature is preferably changed by an iterative process. The iterative process starts, as indicated in step 130, by increasing the isolated layout feature by a predefined increment and repeating the iterative process until the optimized increment is obtained, as discussed below.

In certain embodiments, it is desirable for the size of the predefined increment to be defined by the minimum manufacturing unit for the technology used to fabricate the isolated feature. The minimum manufacturing unit may be set by the available resolution of the lithographic tool used to form patterns on a semiconductor wafer. In some embodiments, for example, the predefined increment is about 0.03 microns, and more preferably about 0.02 microns. In other embodiments, the predefined increment is defined as a fraction of the maximum extent of shrinkage predicted to occur due to over-etching of the isolated feature during integrated circuit fabrication. In certain embodiments, for instance, the predefined increment is about 20 percent, and more preferably, about 10 percent of the predicted maximum extent of shrinkage. In other embodiments, however, the predefined increment is substantially equal to the predicted maximum extent of shrinkage.

The predefined increment may be added to at least one lateral dimension of the isolated layout feature followed by a step 135 of determining a distance between an increased lateral dimension of the isolated layout feature and another layout feature. The increased lateral dimension is identified as a rejected dimension if the distance is less than the minimum separation distance. Alternatively, the increased lateral dimension is identified as an accepted lateral dimension if the distance is equal to or greater than the minimum separation distance. Subsequent cycles of the iteration are directed to only those lateral dimensions that are identified as accepted. Thus the increased lateral dimension is increased by the predefined increment when the lateral dimension is an accepted lateral dimension.

This iterative process may further include a step 140 of decreasing the increased lateral dimension by the predefined increment when the lateral dimension is a rejected lateral dimension. For instance, the above-described distance determination may reveal that all lateral dimensions of an isolated layout feature violate the minimum separation distance rule. In this case, the isolated layout feature is rejected as one whose lateral dimensions are suitable for an increase. The original lateral dimension is restored by decreasing the previously increased lateral dimension by the appropriate amount such that the minimum separation distance rule is not violated. For instance, the original lateral dimension is restored by subtracting the predefined increment that was added to the lateral dimension in step 130.

For other isolated features, however, some lateral dimensions may violate the minimum separation distance rule while others do not. The predefined increment will be subtracted from the rejected increased lateral dimension, while the accepted increased lateral dimension is retained and subject to additional iterative cycles, as discussed elsewhere herein. If so desired, the iterative process can be stopped when the number of predefined increments added to the lateral dimension equals or exceeds the predicted maximum extent of shrinkage due to etching, or when all increased lateral dimensions of the isolated layout feature are rejected.

In certain advantageous embodiments, the iterative process further includes, a step 145, of adding a corner feature to the isolated layout feature. A corner feature is added to the accepted lateral dimension if the isolated layout feature has two adjacent accepted lateral dimensions. The dimensions of the corner feature added is preferably defined by the predefined increment added to the accepted lateral dimension and adjacent accepted lateral dimension. For example, if a predefined increment of 0.02 micron increments was added to the accepted lateral dimension and a 0.03 micron increment was added to the adjacent accepted lateral dimension, then the corner feature's dimensions would be 0.02 microns by 0.03 microns.

In addition, both of the accepted lateral dimension and the adjacent accepted lateral dimension must not violate the minimum separation distance. After the addition of a corner feature, the iterative process also preferably includes determining the distance between the isolated layout feature having an added corner feature and another feature. If the distance is less than the minimum separation distance, then the corner feature is removed in step 150. If the distance is equal to or greater than the minimum separation distance then the corner feature is accepted, and the isolated layout feature is subjected to further iterations of increasing at least one lateral dimension, as described above.

In certain embodiments, for example, where the predefined increment is substantially equal to or greater than the predicted maximal extent of shrinkage, the iterative process comprises decreasing, in step 140, the predefined increment by a reduction increment to obtain the optimized increment. The reduction increment is preferably equal to a fraction of the predicted maximal extent of shrinkage, for example 20 and more preferably 10 percent. The reduction increment is also preferably at least as large as the minimum manufacturing unit for the technology used to fabricate the isolated feature, as discussed above.

Figure 2A:
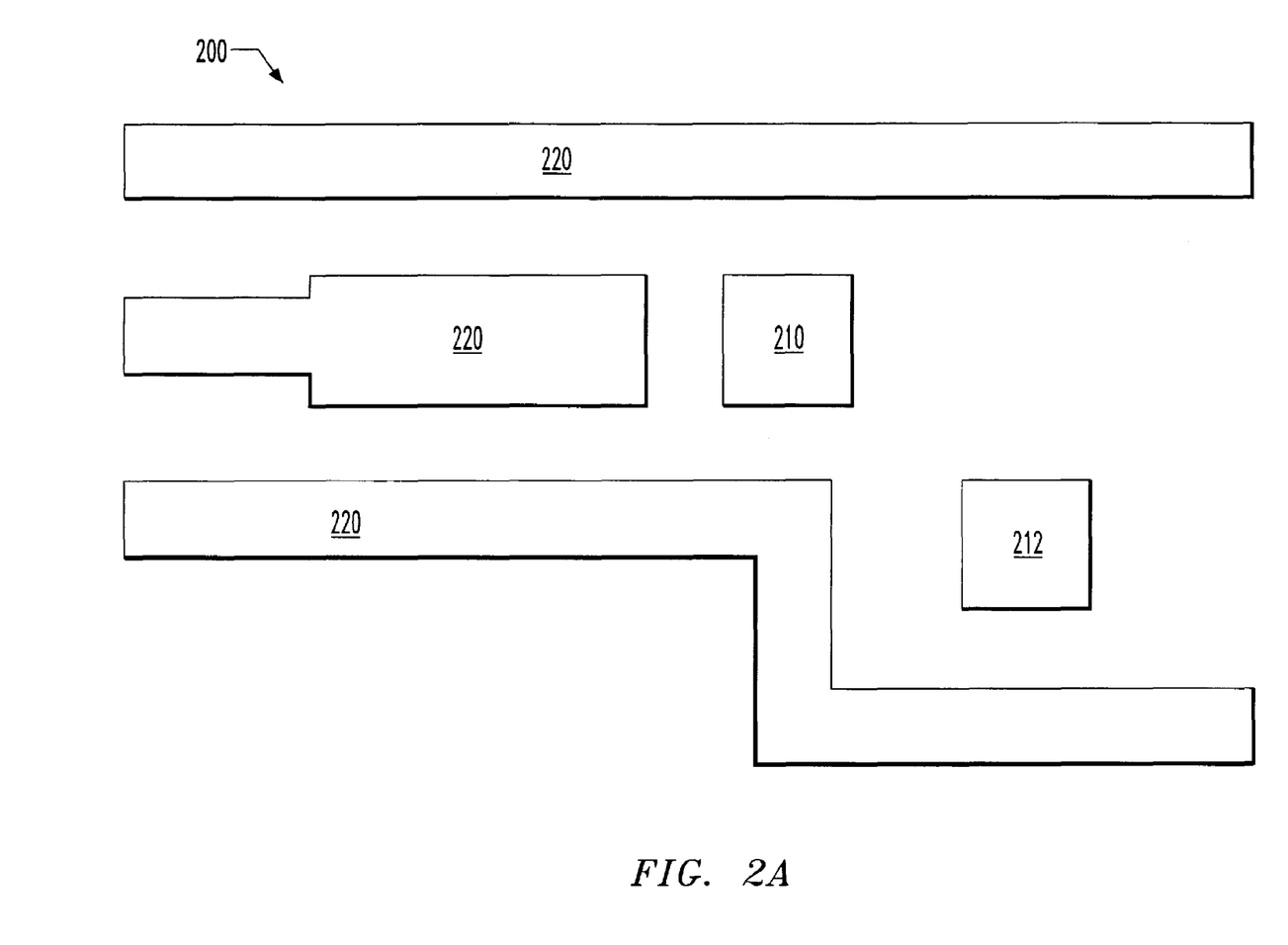
FIGS. 2A to 2E present top views of selected steps of designing a portion of an integrated circuit layout using an embodiment of the process of the present invention.

To illustrate the application of one embodiment of the present invention, FIGS. 2A to 2E present top views of selected steps in designing a portion of a feature layout, for example an integrated circuit layout. FIG. 2A presents a portion of a feature layout 200 prior to modification by an iterative process as described above with respect to FIGS. 1A and 1B. FIG. 2A further depicts the identification of two isolated layout features 210, 212, each having an area within a predetermined range and being separated from adjacent non-isolated layout features 220 by a predefined distance.

Figure 2B:
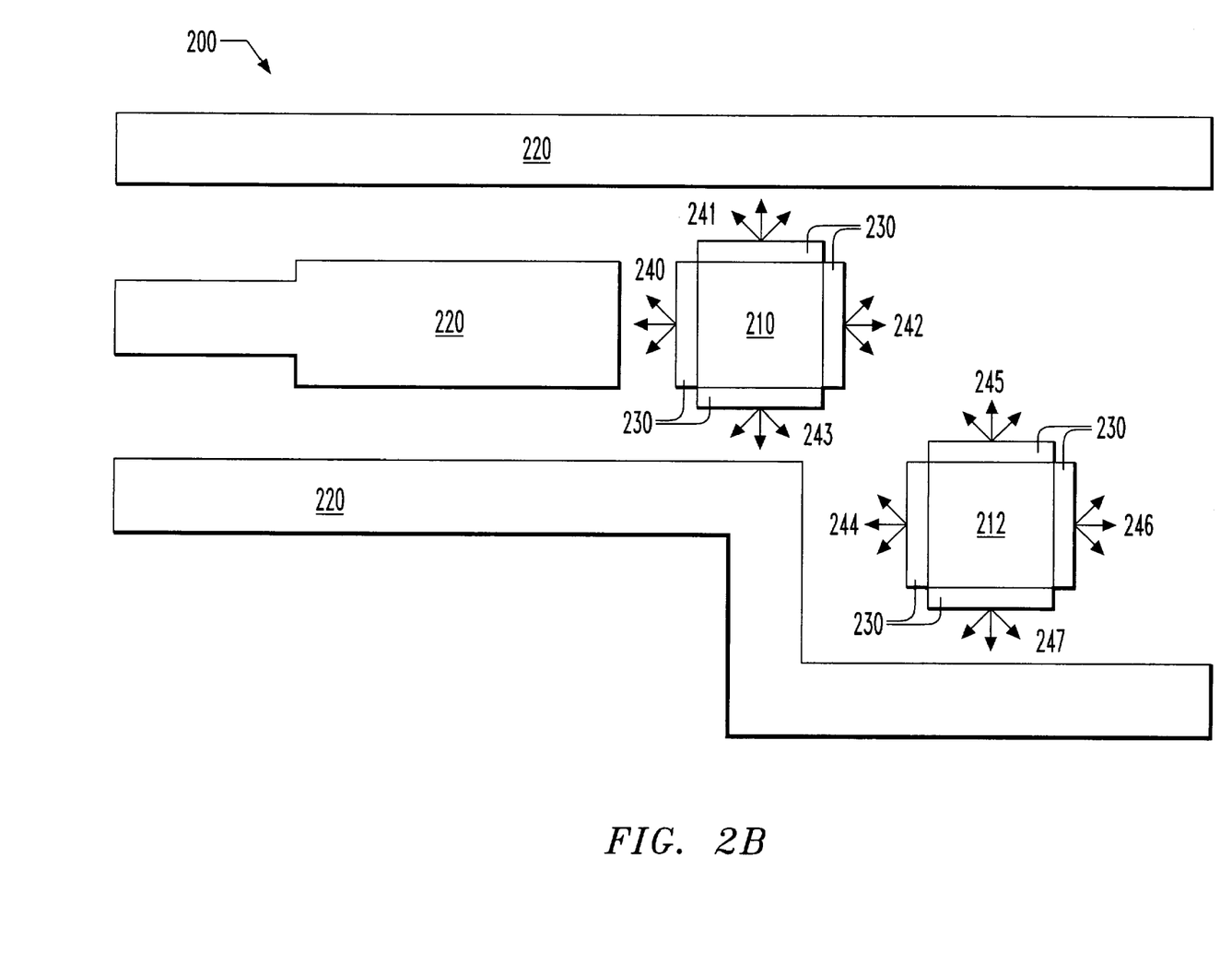

FIG. 2B illustrates the non-global addition of a predefined increment 230 to lateral dimensions of the isolated layout features 210, 212. This is followed by determinations of the distances from lateral dimensions 240, 241, 242, 243, 244, 245, 246, 247 between the increased isolated layout feature and non-isolated features 220 and the other isolated layout features 210, 212. The arrow shown in FIG. 2B illustrate that distance determinations include measuring the diagonal distance between layout features, for example, between isolated layout features 210, 212.

Figure 2C:
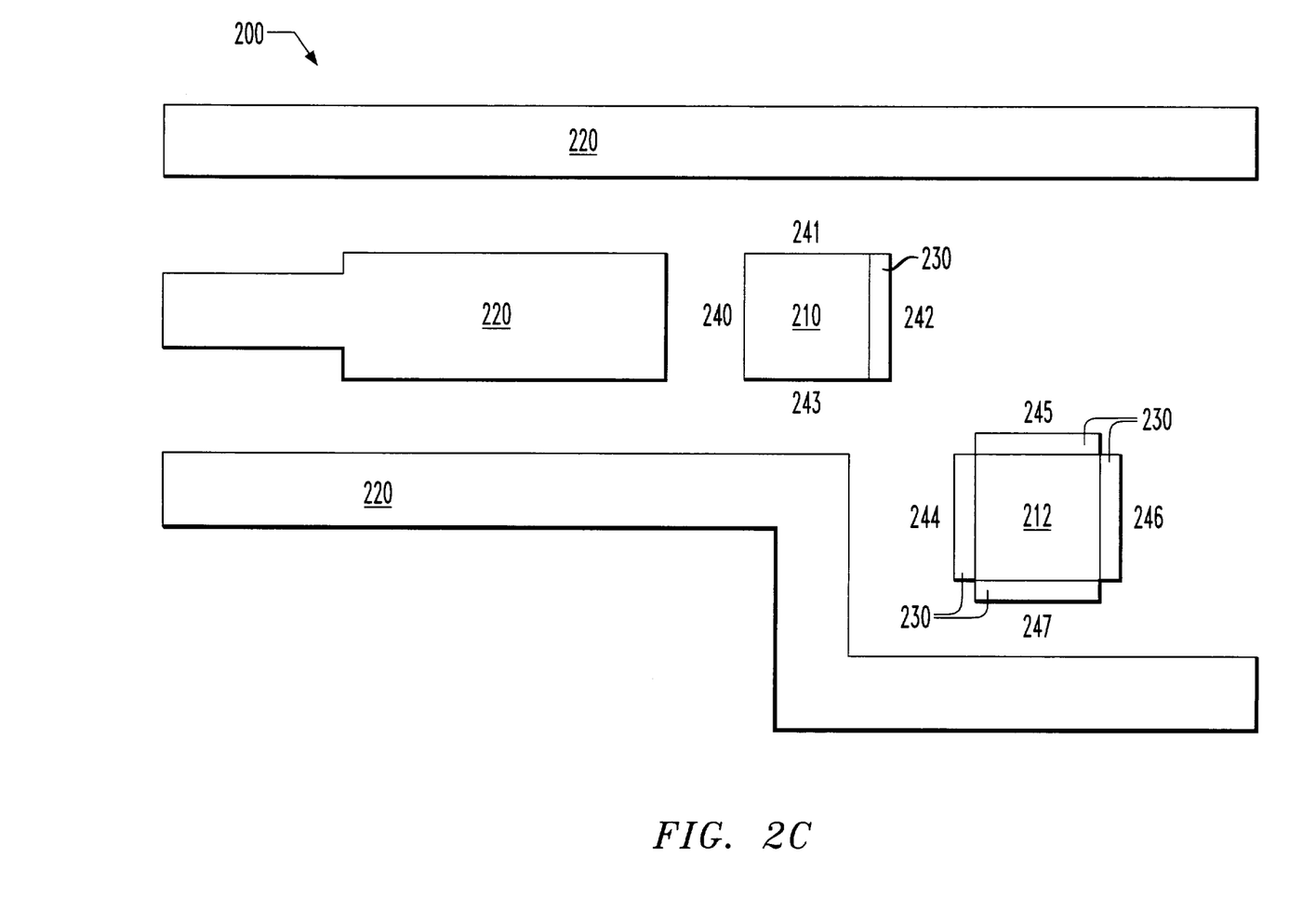

As illustrated in FIG. 2C, increases in the isolated layout features 210, 212 are only accepted for lateral dimensions 242, 244, 245, 246, 247 where the distances are greater than a designated minimum separation distance rule for the layout 200. In the illustrated embodiment of isolated layout feature 210, the predefined increments have been removed from the rejected lateral dimensions 240, 241, 243 because they violated the minimum separation distance rule. Again, it should be noted that the lateral dimensions of the non-isolated features 220 are not modified, and therefore, left unchanged by this process.

Figure 2D:
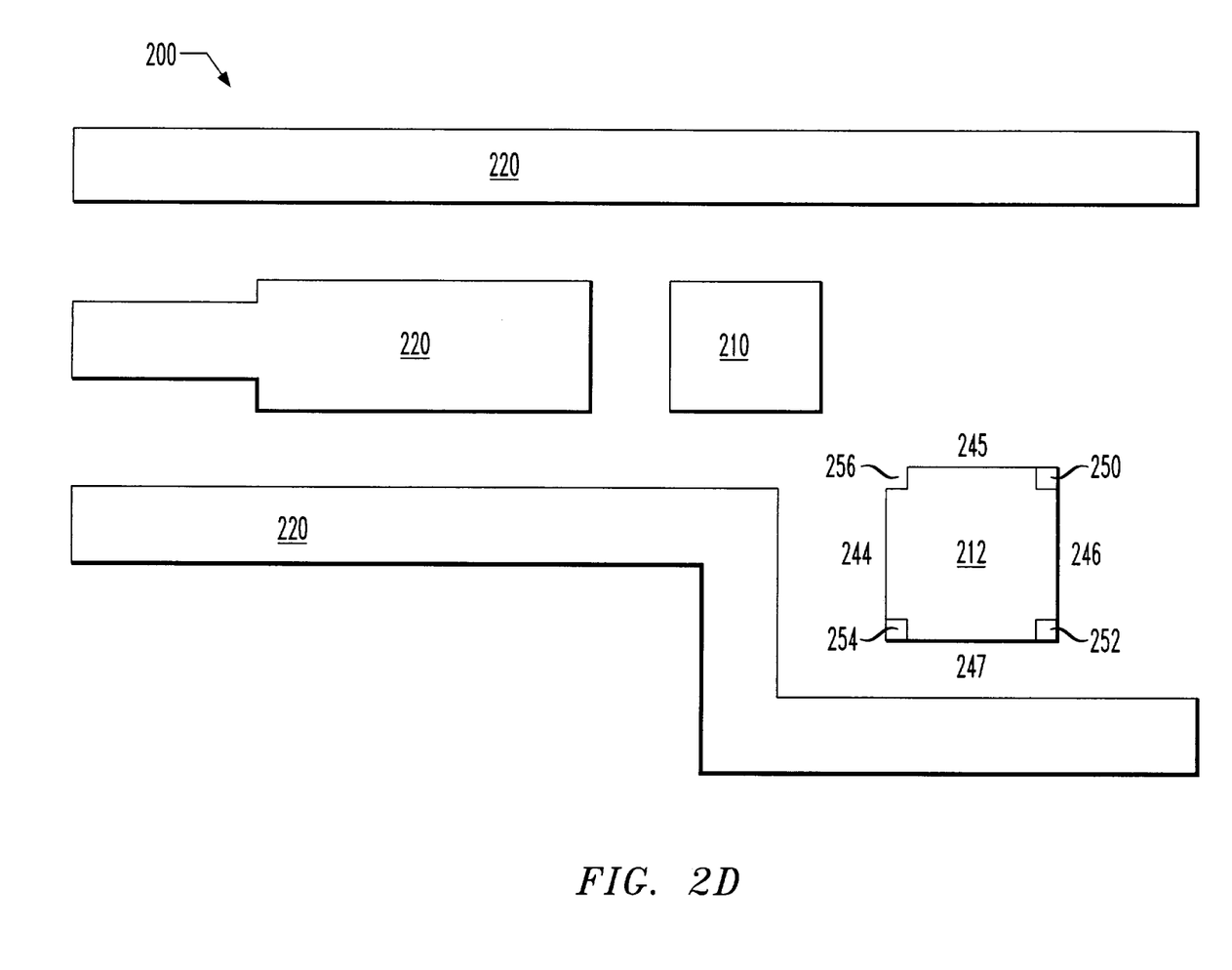

FIG. 2D illustrates the addition of corner features 250, 252, 254 to the isolated layout feature 212 having two adjacent accepted lateral dimensions: 245, 246; 246, 247;

and 244, 247. A corner feature was not added to one corner 256 of adjacent lateral dimensions 244, 245 because the minimum separation distance between the isolated layout feature 212 and another isolated layout feature 210 would be violated.

Figure 2E:
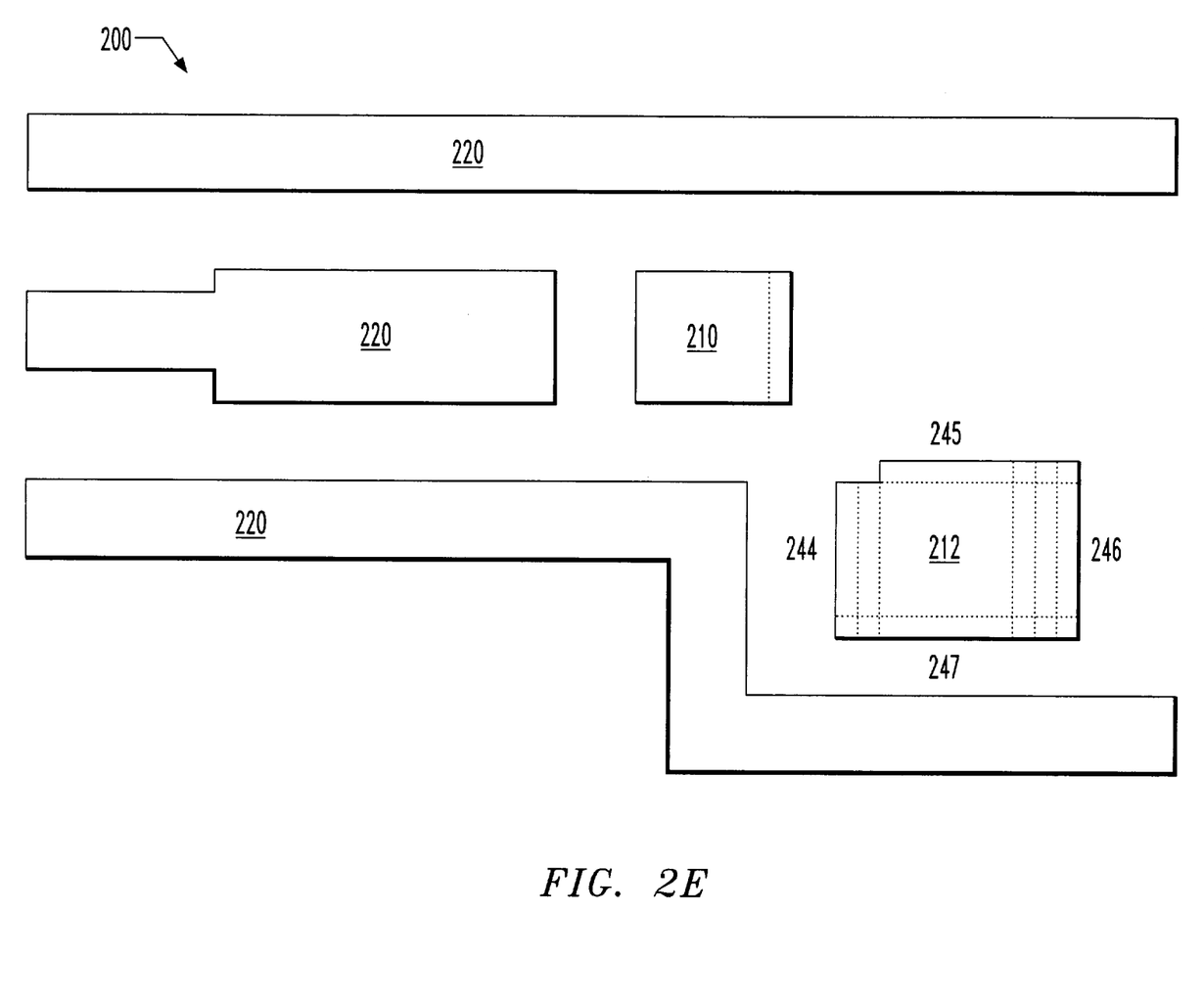

FIG. 2E illustrates the layout 200 after two more repetitions of the iterative non-global process where the predefined increment was added to accepted lateral dimensions, corner features and violations in the minimum separation distance were carried in similar fashion to than described above. For instance, the iterative process was stopped because the total number of predefined increments added to one lateral dimension 246 was equal to the predicted maximum shrinkage of isolated features. In addition all other lateral dimensions 244, 245, 247 of the isolated layout feature 212 were rejected lateral dimensions.

Figure 3:
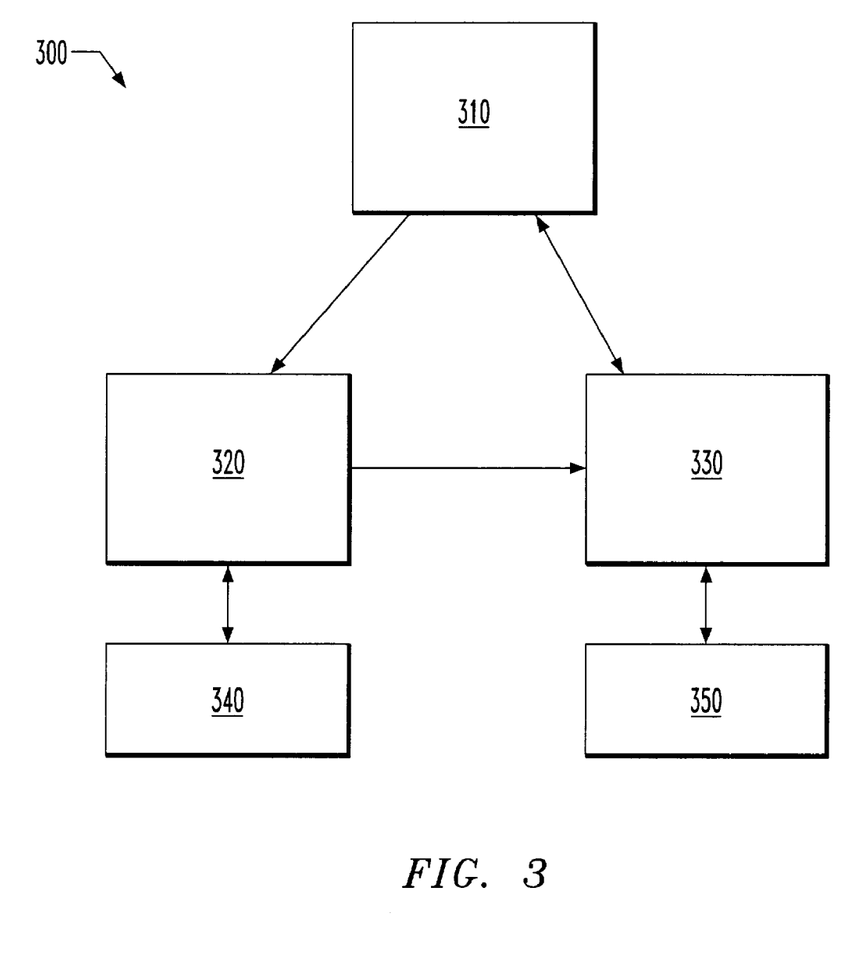
FIG. 3 illustrates a block diagram of one embodiment of a system for non-global modification of an integrated circuit layout, described in a data file.

FIG. 3 presents a block diagram of one embodiment of a system 300 for modifying an integrated circuit layout, described in a data file 310. The system 300 includes an isolation subsystem 320 configured to locate an isolated layout feature of an integrated circuit layout that is located adjacent another layout feature of the integrated circuit layout. The system further includes a non-global modification subsystem 330 configured to change at least one lateral dimension of the isolated layout feature to obtain an optimized increment while not violating a minimum separation distance between the isolated layout feature and the another layout feature.

Any of the above-described processes may be advantageously incorporated into the system 300. In certain embodiments, for example the isolation subsystem 320 further comprises program instructions 340 to determine an area of a target layout feature and selecting the target layout feature when said area is within a predefined range. In other embodiments, the non-global modification subsystem 330 further comprises program instructions 350 implementing an iterative process including increasing the isolated layout feature by a predefined increment and repeating the iterative process until the optimized increment is obtained.

In certain embodiments, the system 300 is stored in a computer readable media comprising any computer storage tools including but not limited to hard disks, CDs, floppy disks, and memory or firmware. In such embodiments, the system 300 is capable of causing a computer to execute program code instructions that embody subsystems 320, 330. In certain preferred embodiments, for example, the system 300 is read by a computer capable of compiling a computer-aided design program for the design and rule checking of integrated circuit layouts, such as Hercules™ (Synopsys®, Mountain View, Calif.). The subsystems 320, 330, in turn, are capable of modifying a data file having an integrated circuit layout created by the integrated circuit design program language.

Figure 4:
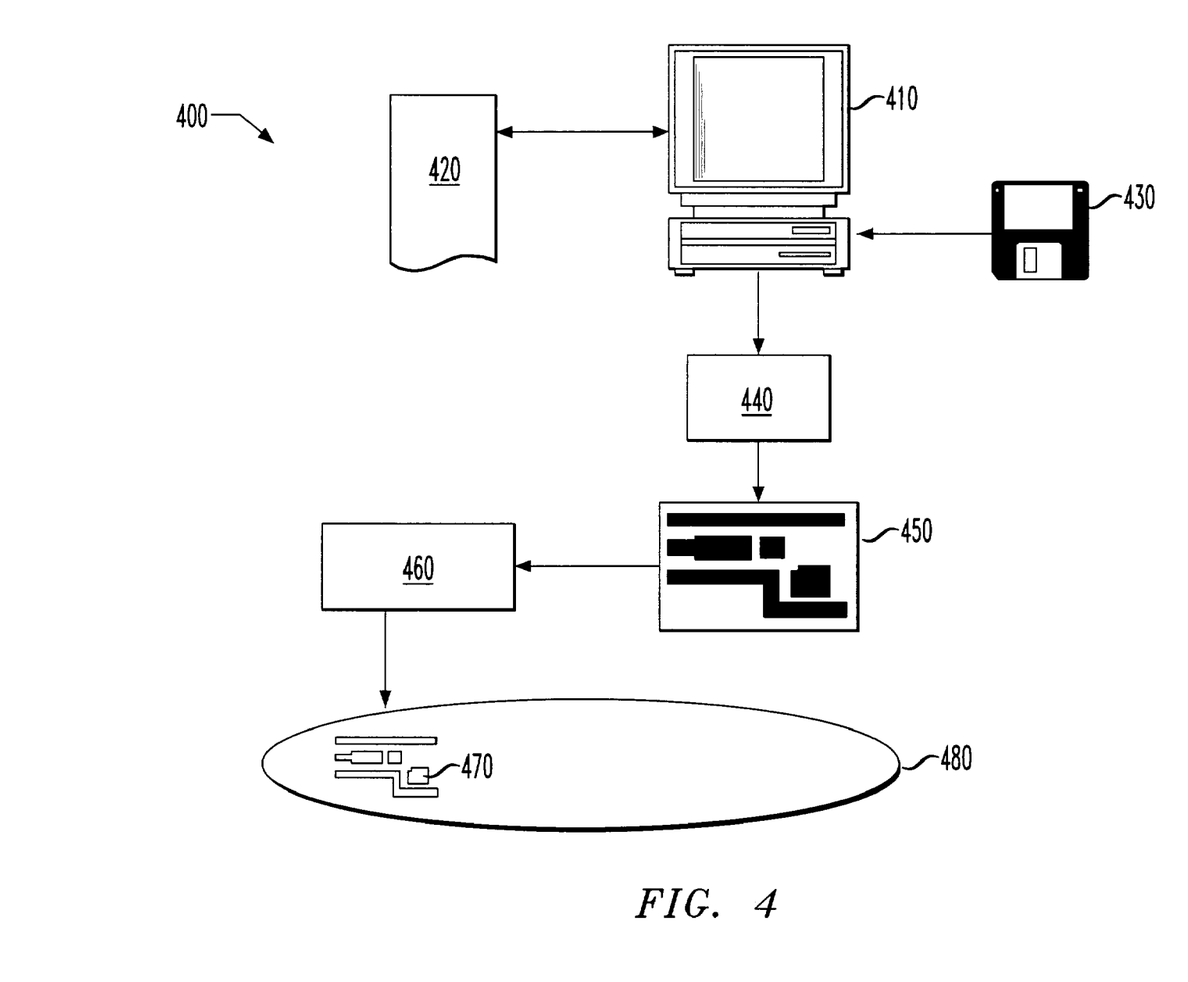
FIG. 4 depicts a block diagram of an integrated circuit design system embodying the principles of the present invention.

FIG. 4 depicts a block diagram of yet another embodiment of the present invention, an integrated circuit design system 400. The exemplary system 400 depicted comprises a computer system 410 configured to read a data file 420 having an integrated circuit layout stored therein. The system 400 further includes a computer readable media 430 that stores a system for non-globally modifying some isolated layout features described in the data file 420 by issuing program instructions that cause the computer system 410 to modify the data file 420. Certain embodiments of the design system 400 further include a conventional pattern generating tool 440 coupled to the computer system 410. The pattern generating tool 440 is capable of producing a reticle 450 that represents the intergrated circuit layout in the modified data file 420. In other embodiments, the system 400 further includes a lithographic tool 460 capable of producing an isolated feature in an integrated circuit layout 470 having an optimized increment in a wafer 480.

As further demonstrated in the example section presented below, isolated features produced from the isolated layout features of the present invention have a more uniform area as compared to conventionally produced isolated features. Also as further illustrated below, the yield per wafer 470 of functional integrated circuit dies fabricated from layouts that incorporate isolated layout features of the present invention is greater than the yield from conventional layouts.

Having described the present invention, it is believed that the same will become even more apparent by reference to the following examples. It will be appreciated that the examples are presented solely for the purpose of illustration and should not be construed as limiting the invention. For example, although the experiments described below may be carried out in a laboratory setting, one of ordinary skill in the art could adjust specific numbers, dimensions and quantities up to appropriate values for a full scale plant.

EXAMPLES

Embodiments of the present invention advantageously provide a robust process for fabricating isolated features, even in the presence of sub-optimal lithographic processing conditions. It is known, for example, that the depth of focus of lithographic tools used to define an isolated feature can drift over time. Using conventional non-compensated circuit design layout rules, this can cause the area of the isolated feature to be smaller than desired. In contrast, the present invention facilitates the production of a more uniform pillar size.

Figure 5A:
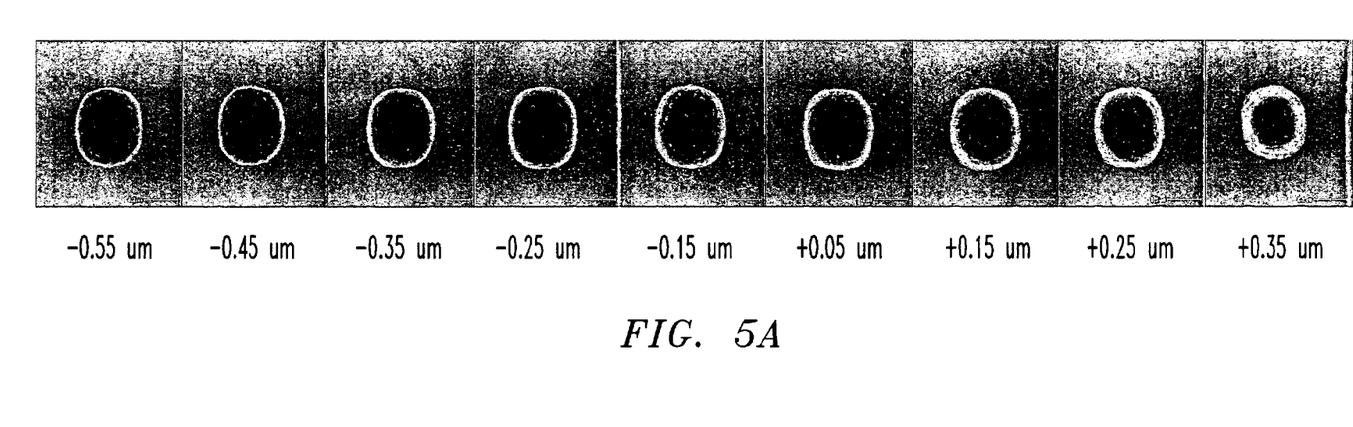
FIG. 5A presents exemplary scanning electron microscopy images of isolated pillar features fabricated using a reticle constructed from an embodiment of the process for designing an integrated circuit layout according the principles of the present invention.
Figure 5B:
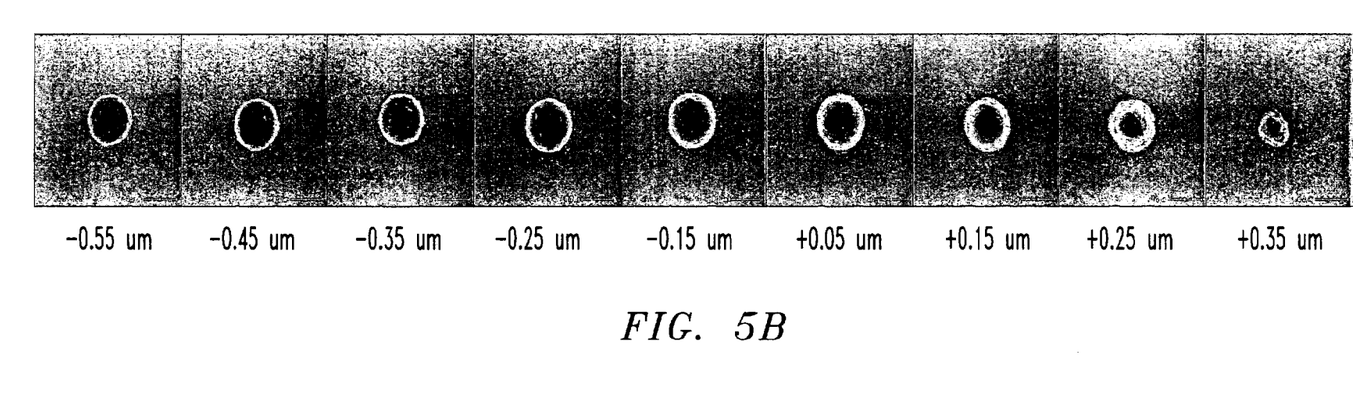
FIG. 5B presents exemplary scanning electron microscopy images of isolated pillar features fabricated using a reticle constructed from a conventionally designed circuit layout.

To illustrate this, test pillar structures were made from a layout that was subjected to an embodiment of the design process of the present invention ("Compensated"), and compared to conventionally designed pillars ("Control"). Compensated pillars were made from a layout design that included the use of an expanding iterative process to increase the size of isolated pillar features, similar to that illustrated in FIG. 1. The minimal increment of increase in a side for the pillar's layout was 0.02 microns and the maximal allowed total increase was 0.06 microns. The compensated and control layouts were then used to produce 0.32×0.32 micron area aluminum pillars having a height of about 6400 Angstroms. The same lithographic tools and etching producers were used to produce pillars using the compensated and control layout. In addition, different pillars were made with the depth of focus of the lithographic tool varied from about −0.55 to about +0.35 microns. FIG. 5A shows top view exemplary scanning electron microscopy (SEM) images of compensated pillars versus control pillars (FIG. 5B). The compensated pillars had a substantially more uniform area than the control pillars. For example, the areas of compensated pillars shown in FIG. 5A varied by less than ±20 percent, over a depth of focus ranging from about −0.55 to about +0.35 microns. In comparison, the area of the control pillars in FIG. 5B varied by about ±43 percent.

The ability of the present invention to produce uniform sized pillars over a range of depth of focus facilitates the production of higher yields of functional integrated circuits per wafer as compared to conventionally designed integrated circuits. As example, compensated integrated circuits were constructed from a layout subjected to the same expanding iterative process used to produce the isolated pillar features shown in FIG. 5. Analogous integrated circuits were constructed using a conventional circuit layout, and used as controls. The depth of focus across the wafers was about −0.55 to about 0.25 microns. The yield of functional compensated integrated circuits per wafer was higher than control non-compensated integrated circuits (e.g., about 1149 to about 1041 versus about 981 to about 975 circuit dies per wafer, respectively). In particular, the number of circuit dies is increased in the edge regions of the wafer.

Although the present invention has been described in detail, one of ordinary skill in the art should understand that they can make various changes, substitutions and alterations herein without departing from the scope of the invention.

What is claimed is:

1. A non-global process for fabricating an integrated circuit having at least one isolated feature, comprising:
   lithographically defining an isolated feature in a layer of a material wherein at least one dimension of the isolated feature is selected by locating an isolated layout feature of an integrated circuit layout, said isolated layout feature located adjacent to another layout feature of said integrated circuit layout wherein said locating an isolated layout feature of an integrated circuit layout comprises determining an area of a target layout feature and selecting said target layout feature as said isolated layout feature when said area is within a predefined range; and
   changing at least one lateral dimension of said isolated layout feature to obtain an optimized increment while not violating a minimum separation distance between said isolated layout feature and said another layout feature, wherein said non-global process leaves non-isolated features unchanged.

2. The process as recited in claim 1, wherein said isolated layout feature has a parallelepiped structure.

3. The process as recited in claim 1, wherein changing said at least one lateral dimension comprises an iterative process including increasing said isolated layout feature by a predefined increment and repeating said iterative process until said optimized increment is obtained.

4. The process as recited in claim 3, wherein said iterative process further includes determining a distance between an increased lateral dimension of said isolated layout feature and said another layout feature, and identifying said increased lateral dimension as a rejected dimension if said distance is less than said minimum separation distance, or as an accepted lateral dimension if said distance is equal to or greater than said minimum separation distance.

5. The process as recited in claim 4, wherein said iterative process further includes increasing said increased lateral dimension by said predefined increment when said lateral dimension is an accepted lateral dimension.

6. The process as recited in claim 4, wherein said iterative process further includes decreasing said increased lateral dimension by said predefined increment when said lateral dimension is a rejected lateral dimension.

7. The process as recited in claim 4, wherein said iterative process further includes adding a corner feature to said accepted lateral dimension if said isolated layout feature has an adjacent accepted lateral dimension and said accepted lateral dimension and said adjacent accepted lateral dimension having said corner feature do not violate said minimum separation distance.

8. The process as recited in claim 1, wherein changing said at least one lateral dimension comprises an iterative process including increasing said at least one lateral dimension by a predefined increment and decreasing said predefined increment by a reduction increment to obtain said optimized increment.

9. The process as recited in claim 8, wherein said predefined increment is substantially equal to a predicted maximal shrinkage of an isolated feature fabricated from said integrated circuit layout.

10. A system for performing non-global modification of an integrated circuit layout described in a data file, comprising:
    an isolation subsystem configured to locate an isolated layout feature of an integrated circuit layout, said isolated layout feature located adjacent to another layout feature of said integrated circuit layout wherein said isolation subsystem further comprises determining an area of a target layout feature and selecting said target layout feature as said isolated layout feature when said area is within a predefined range; and
    a modification subsystem configured to change at least one lateral dimension of said isolated layout feature to obtain an optimized increment while not violating a minimum separation distance between said isolated layout feature and said another layout feature, wherein said non-global modification leaves non-isolated features unchanged.

11. The system recited in claim 10, wherein said modification subsystem further comprises an iterative process including increasing said isolated layout feature by a predefined increment and repeating said iterative process until said optimized increment is obtained.

12. The system recited in claim 11, wherein said iterative process further includes determining a distance between an increased lateral dimension of said isolated layout feature and said another layout feature, and identifying said increased lateral dimension as a rejected dimension if said distance is less than said minimum separation distance, or as an accepted lateral dimension if said distance is equal to or greater than said minimum separation distance.

13. The system recited in claim 12, wherein said iterative process further includes increasing said increased lateral dimension by said predefined increment when said lateral dimension is an accepted lateral dimension.

14. The system recited in claim 12, wherein said iterative process further includes decreasing said increased lateral dimension by said predefined increment when said lateral dimension is a rejected lateral dimension.

15. The system recited in claim 12, wherein said iterative process further includes adding a corner feature to said accepted lateral dimension if said isolated layout feature has an adjacent accepted lateral dimension and said accepted lateral dimension and said adjacent accepted lateral dimension having said corner feature do not violate said minimum separation distance.

16. An integrated circuit design system, comprising:
    a computer configured to read a data file having an integrated circuit layout stored therein;
    a computer readable media capable of causing said computer for performing non-global modification of said data file by:
       locating an isolated layout feature of said integrated circuit layout, said isolated layout feature located adjacent to another layout feature of said integrated circuit layout wherein said locating an isolated layout feature of said integrated circuit layout comprises determining an area of a target layout feature and selecting said target layout feature as said isolated layout feature when said area is within a predefined range; and changing at least one lateral dimension of said isolated layout feature to obtain an optimized increment while not violating a minimum separation distance between said isolated layout feature and said another layout feature, wherein said non-global modification leaves non-isolated features unchanged.

17. The integrated circuit design system recited in claim 16, further includes a lithographic tool capable of defining an isolated feature having said optimized increment in a wafer.

18. The integrated circuit design system recited in claim 17, wherein said lithographic tool is capable of producing an isolated feature from said isolated layout feature having said optimized increment with an area that varies by less than ±20 percent, over a depth of focus of said lithographic tool ranging from about −0.55 to about +0.35 microns.

* * * * *